United States Patent [19]

Latta et al.

[11] Patent Number: 4,458,409

[45] Date of Patent: Jul. 10, 1984

[54] PROCESS FOR PRODUCING NIOBIUM JOSEPHSON JUNCTIONS

[75] Inventors: Eberhard Latta, Adliswil; Marcel Gasser, Zurich, both of Switzerland

[73] Assignee: International Business Machines Corporation, Armonk, N.Y.

[21] Appl. No.: 459,290

[22] Filed: Jan. 20, 1983

[30] Foreign Application Priority Data

Mar. 12, 1982 [EP] European Pat. Off. ........ 82101971.8

[51] Int. Cl.³ ............................................. H01L 39/24
[52] U.S. Cl. .................................. 29/578; 29/576 W; 29/576 C; 29/589; 29/599; 357/5; 427/62; 427/63
[58] Field of Search ................ 29/576 W, 576 C, 578, 29/589, 599; 427/62, 63; 357/4, 5

[56] References Cited

PUBLICATIONS

R. B. Laibowitz et al., "Multilayer Josephson Memory Device," IBM Technical Disclosure Bulletin, vol. 15, No. 11, Apr. 1973, pp. 3316-3317.
R. F. Broom et al., "Quality Improvement of Josephson Junctions by Surface Treatment of the Barrier Layer," IBM Technical Disclosure Bulletin, vol. 21, No. 4, Sep. 1978-p. 1652.
R. F. Broom et al., "All-Niobium Josephson Tunnel Junction with Improved Characteristic," IBM Technical Disclosure Bulletin, vol. 22, No. 4, Sep. 1979, pp. 1661-1662.
R. F. Broom, "Making Josephson Tunnel Junctions," IBM Technical Disclosure Bulletin, vol. 17, No. 8, Jan. 1975, p. 2446.
K. R. Grebe et al., "Josephson Device Using Niobium and Niobium Oxide," IBM Technical Disclosure Bulletin, vol. 13, No. 11, Apr. 1971, p. 3296.
H. Kroger et al., "Selective Niobium Anodization Process for Fabricating Josephson Tunnel Junctions," No. 320 Applied Physics Letters, vol. 39 (1981) Aug., No. 3, pp. 280-282.
G. Hawkins et al., "Nb—Nb Thin-Film Josephson Junctions*," Journal of Applied Physics, vol. 47, No. 4, Apr. 1976, pp. 1616-1619.

Primary Examiner—Brian E. Hearn
Assistant Examiner—Alan E. Schiavelli
Attorney, Agent, or Firm—Carl C. Kling

[57] ABSTRACT

A process for reducing the particle current in the subgap range of all-Nb Josephson junctions. The process results in junctions having substantially increased values of $V_m$. In order to reduce the single particle current, the reaction between the barrier layer oxide and the counter electrode is prevented by additional process steps. After forming the tunnel barrier (4) and before depositing the counter electrode (9), the tunnel barrier surface is covered with a thin, non-continuous layer (5) of a material such as gold which is not reacting with oxygen at process conditions. Subsequently, the non-covered barrier layer surface regions (7) are strongly oxidized thereby forming an oxide layer (8) of sufficient thickness to prevent electron tunneling in these regions.

6 Claims, 6 Drawing Figures

Nb EVAPORATION

OXIDATION

Au EVAPORATION

OXIDATION

Nb EVAPORATION

PROCESS FOR PRODUCING NIOBIUM JOSEPHSON JUNCTIONS

CROSS REFERENCE TO RELATED APPLICATION

This application claims priority under the International Convention for the Protection of Industrial Property, from European Patent Application Ser. No. 82101971.8, filed Mar. 12, 1982 in the European Patent Office.

BACKGROUND OF THE INVENTION

1. Field of the Invention

The invention concerns a process for producing niobium Josephson junctions comprising a niobium base electrode, a niobium-oxide tunnel barrier and a subsequently deposited niobium counter electrode.

2. Description of the Prior Art

Josephson devices comprising one or more Josephson junctions are well known in the art. In the data processing field their application has been suggested particularly for memory cells but also for logic circuitry of a wide variety of layouts and functions.

Various materials have been investigated for both the junction electrodes and the junction barrier layers. All-niobium junctions, to which the present invention is related, exhibit some important advantages over, e.g.,- lead-lead junctions. Niobium (Nb) is, from a technology point of view, a non-critical material with excellent mechanical stability. It also causes fewer diffusion problems and, desirably, its transition temperature $T_c$ is high.

In the past, all-niobium junctions have suffered from poor quality of the oxide layer leading to increased single particle currents or excess currents in the voltage range below the gap voltage. This resulted in a large spread in Josephson current density and in a low value of $V_m$ that determines the operational characteristics of the junction. The main problem has been that depositing a Nb counter electrode on a Nb tunnel barrier caused a degrading of the oxide barrier. Oxygen from the barrier reacted with the niobium resulting in the formation of lower oxides such as NbO and $NbO_2$ thus causing a lower quality junction. $V_m$ values of only 10 to 13 mV could be achieved which are not sufficient for high quality Josephson devices required in today's applications.

Various attempts have been made to overcome these problems. In IBM Technical Disclosure Bulletin, Vol. 15, No. 11, April 1973, pp. 3316/17, the article "Multilayer Josephson Memory Device" discloses a sandwich structure employing intermediate Al layers to prevent degrading of the barrier layer when depositing the Nb counter electrode. The Nb/Al/$Al_2O_3$/Al/Nb structure avoids the problem of reactive material coming in contact with the oxide barrier. The Al layers become superconducting by their proximity to the Nb when kept sufficiently thin. The use of these proximity layers, however, results in a negative effect on the junction characteristics.

In IBM Technical Disclosure Bulletin, Vol. 21, No. 4, September 1978, p. 1652, the article "Quality Improvement of Josephson Junctions by Surface Treatments in the Barrier Layer" proposes to submit the barrier layer to an RF plasma treatment in a nitrogen atmosphere before depositing the top electrode. The improvement is caused by the replacement of absorbed oxygen molecules by nitrogen and by some additional interaction of nitrogen with the surface of the barrier. This allows the Nb counter electrode to react with a nitride or with nitrogen instead of oxygen. Tests have, however, shown that this process does not sufficiently prevent the Nb of the counter electrode from reacting with the oxygen of the barrier layer.

In IBM Technical Disclosure Bulletin, Vol. 22, No. 4, September 1979, pp. 1661/62, the article "All-Niobium Josephson Tunnel Junction with Improved Characteristic" proposes to provide a thin niobium carbide (NbC) layer on the barrier oxide prior to deposition of the Nb counter electrode to prevent the reaction between the Nb and the barrier layer oxide to take place. Again, this method has not been successful since it has proven to be too difficult to produce the required carbide layer without damaging the barrier layer.

All these approaches were quite different from the novel process herein described and did not result in the required improvement.

In IBM TDB, Vol. 17, No. 8, January 1975, p. 2446, the article "Making Josephson Tunnel Junctions" discloses a lead (Pb) junction structure in which the barrier layer is covered with a continuous film of gold to protect the barrier surface from contamination during subsequent lithographic steps. The gold diffuses into the low melting Pb. Although the use of the gold layer suggests some similarities with the present invention, the process conditions and parameters, the type of junctions to which the process is applied as well as the purpose and effect achieved are totally different: in the present process, applied to all-Nb junctions and not to Pb junctions, a non-continuous layer of e.g. gold is required in order to permit a subsequent partial oxidation of the barrier layer and to prevent adhesion problems that occur when the Nb counter electrode is deposited onto a continuous gold layer. These requirements and problems do not exist for the structure and materials of the prior art reference.

SUMMARY OF THE INVENTION

It is a main object of the present invention to provide a process for producing an all-Nb Josephson junction with an increased $V_m$ by preventing the Nb counter electrode from reacting with the oxygen of the oxide barrier layer. Another object is to present a junction with reduced capacitance thereby providing for higher switching speed operations. A further object is to provide a Josephson junction with improved characteristics that can be manufactured using well known and controllable process steps.

These objects are met by the process herein described that is characterized in that, after forming the tunnel barrier on the base electrode, and before depositing the counter electrode, the tunnel barrier surface is covered with a thin, non-continuous layer of a material not reacting with oxygen at process conditions, and that, in a subsequent step, the non-covered barrier layer surface regions are strongly oxidized thereby forming an oxide layer of sufficient thickness substantially preventing electron tunneling in these regions.

The disclosed process provides for all-Nb Josephson junctions suitable for application in current high-speed integrated circuit technologies, a goal that has not been accomplished with hitherto known processes and junction structures. This is achieved without adding critical or unpredictable process steps, i.e., without substantially reducing the reproducibility.

BRIEF DESCRIPTION OF THE DRAWINGS

One way of carrying out the invention is described in detail below with reference to drawings which illustrate one specific embodiment, and in which FIG. 1 A through E schematically illustrate the process steps involved in producing the niobium junctions with improved characteristics, particularly with an increased $V_m$.

Figure 1A:

Briefly, the junction fabrication process in accordance with the invention involves the following steps. Initially, a planar substrate of e.g. silicon (Si) coated with an insulating layer is provided. Next, the base electrode consisting of Nb, an Nb alloy or any other suitable high melting superconducting material is deposited. Thereafter, the tunnel barrier oxide layer is obtained in an oxidation process. If Nb is used as base electrode material, the oxide will be $Nb_2O_5$. Subsequently, the surface of this layer is covered with a thin, non-continuous layer of a material not reacting with oxygen at process conditions. Gold is an example. In a following step, the non-covered barrier layer surface regions are strongly oxidized whereby an oxide layer of sufficient thickness is formed that prevents electron tunneling in these regions. To complete the junction, the counter electrode, which may consist of the same material as the base electrode, is deposited, covering both the non-continuous layer and the thick oxide in regions of "holes" in the non-continuous layer.

In the Josephson junction thus obtained, the effective junction area is reduced to the regions where the gold or other suitable material is applied. The very thin gold layer becomes superconducting because of its close proximity to the superconducting Nb. It, therefore, does not prevent the tunnel current from flowing and does not substantially influence the operation or characteristics of the $Nb_2O_5$-Nb interface.

On the other hand, the oxide formed in regions where no gold film is present is of a thickness that is sufficient to prevent the tunnel current. As will be shown below, the oxide extends into the Nb base electrode.

The resulting structure eliminates the problems normally encountered because of the oxygen transfer from the oxide layer to the reactive counter electrode material. In the effective junction regions, i.e., where tunnel currents will flow, direct contact of the oxide layer and the counter electrode is avoided by the layer of non-reacting material, e.g., gold. Any reaction that may take place in regions where the oxide and the counter electrode material are in direct contact has no negative effect since it occurs in regions where tunnel currents are prevented by the thick oxide. These ineffective regions do not contribute to the junction operation.

In the regions where the oxide thickness is largely increased to prevent tunneling, the capacitance is largely decreased. This leads to a reduction of a total junction capacity and thus to an increase in switching speed.

The following detailed process description is, for sake of simplicity, restricted to the major steps involved. Not shown or explained in detail are those well known steps that are required to etch, to clean, and to pattern the various layers and to obtain the desired junction structure. All processes can be carried out using equipment that is conventionally available and commonly used in Josephson device production processes.

One way of carrying out the invention will now be described in more detail with reference to the figures.

Figure 1B:
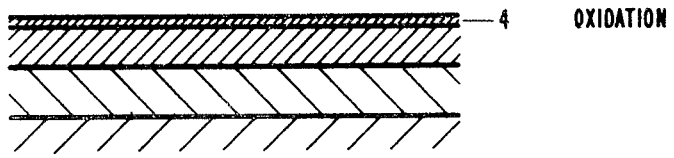

FIG. 1A shows a silicon substrate 1 coated with an insulating layer 2, 3000Å thick and consisting of $SiO_2$. Deposited onto this insulation is an Nb layer of 2500Å thickness serving as base electrode of the junction. In a subsequent oxidation, the $Nb_2O_5$ barrier layer 4 (FIG. 1B) of 15 to 20Å thickness is formed. Preferably a RF plasma treatment is used with an RF voltage of 160V and at a pressure of $3 \cdot 10^{-3}$ Torr.

Figure 1C:
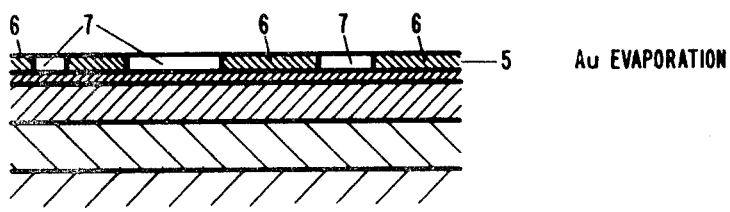

In a next step, performed at room temperature and in a vacuum of less than $10^{-8}$ Torr, a thin layer (5) of gold is applied (FIG. 1C). The evaporated amount of gold corresponds or is equivalent to that of a continuous layer of 30Å thickness. Since the gold does not form a continuous layer when evaporated at room temperature in such small quantities, a non-continuous layer is formed. The underlaying barrier layer 4 is covered only in regions 6 whereas region 7, representing approx. 20 to 40% of the total junction area, remain uncovered.

Figure 1D:
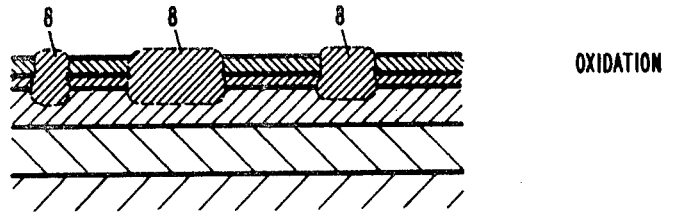

This step is followed by another RF plasma oxidation at 360V and at a pressure of $3 \cdot 10^{-3}$ Torr. As illustrated by the dotted lines (FIG. 1D), the uncovered regions 7 are strongly oxidized. The thickness of the $Nb_2O_5$ oxide layer 8 which extends into the base electrode 3 is approximately 50Å, i.e., it is sufficiently thick to prevent any tunneling in the regions of the junction which, through this oxidation, have been made ineffective.

Figure 1E:
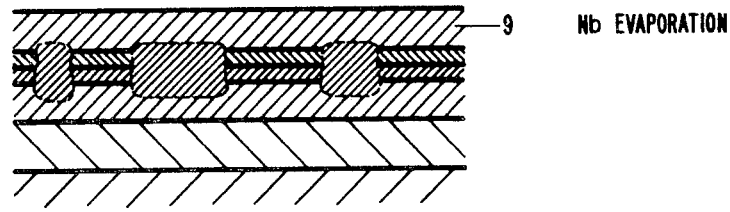

The junction is completed by the evaporation of a Nb layer 9 (FIG. 1E) of 2500Å thickness forming the counter electrode. It is deposited onto the gold layer 5 and, in regions 7, on top of the thick oxidation layer 8. For this evaporation process a vacuum of $5 \cdot 10^{-8}$ Torr is used.

All process steps outlined in detail above are carried out at room temperature and, starting from the oxidation of the barrier layer, can all be performed in sequence without removing the sample from the vacuum chamber.

In the resulting junction structure, the total junction area is split into an effective area comprising those regions where the gold layer is present, preventing degrading of the oxide barriers, and an ineffective area comprising those regions with no gold layer being present but where the thick oxide prevents any tunneling and thus any negative impact by the oxygen transfer that does take place in these regions.

Figure 2:
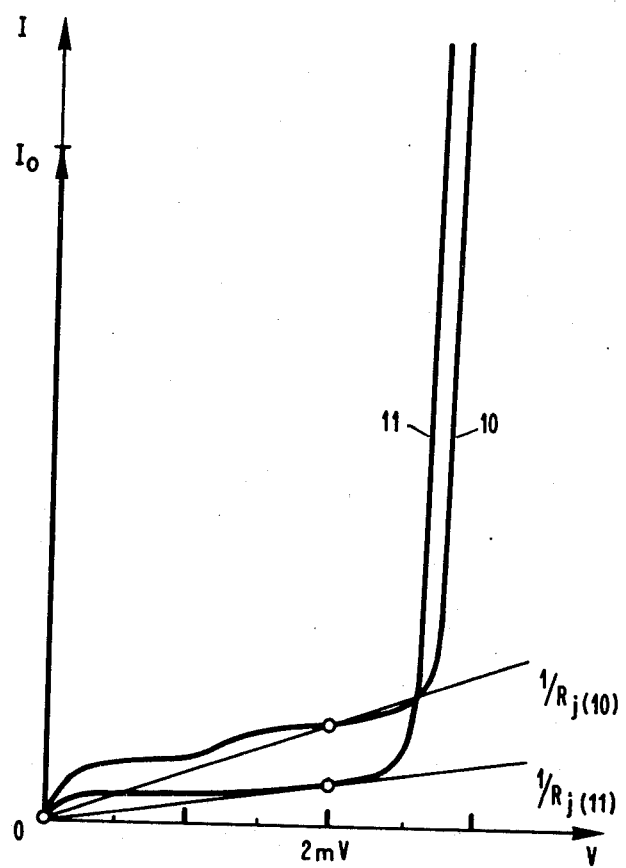
FIG. 2 shows the I/V-characteristic of an all-Nb Josephson junction produced with hitherto known processes in comparison with the characteristic of a Josephson junction produced in accordance with the inventive process.

In FIG. 2 the I/V-characteristic of a junction produced with hitherto known processes (curve 10) is compared with that of a junction produced in accordance with the process herein described (curve 11). These curves clearly demonstrate the substantial reduction of the excess current in the sub-gap voltage range, i.e., in the range below approx. 2.5 mV. This is also reflected in an increase of the $V_m$ value which is defined as follows:

$$V_m = I_{m0} \cdot R_j = I_{m0} \cdot U/I$$

with $I_{m0}$ = max. Josephson current $R_j = \dfrac{U}{I}$ = voltage/current ratio at V = 2 mV.

$1/R_j$ being the slope of the line connecting the origin of coordinates with the I/V-curve at 2 mV, the $V_m$ values for the two junctions have been determined as $$V_{m(curve\ 10)} = 13\ mV.$$

$$V_{m(curve\ 11)} = 30\ mV.$$

High excess currents, resulting in low $V_m$ values, severely affect the operating characteristics that determine the applicability of Josephson junctions in both, logic and memory applications. The achieved increase in $V_m$ to 30 from a value of 13 which is to be considered unacceptable for most applications, is an evident advantage provided for by the present invention.

It is noted that the inventive concept has been described with reference to the specific process explained above but it will be appreciated that process parameters, materials and junction structure other than those of the example can be chosen applying the guidelines expressed herein.

We claim:

1. Process for producing niobium Josephson junctions comprising a niobium base electrode, a niobium-oxide tunnel barrier, and a subsequently deposited niobium counter electrode, characterized in that, after forming the tunnel barrier (4) on the base electrode (3) and before depositing the counter electrode (9), the tunnel barrier surface is covered with a thin, non-continuous layer of gold (5) and that, in a subsequent step, the non-covered barrier layer surface regions (7) are strongly oxidized thereby forming an oxide layer (8) of sufficient thickness substantially preventing electron tunneling in these regions.

2. Process as claimed in claim 1, characterized in that the non-continuous gold layer (5) is evaporated at room temperature.

3. Process as claimed in claim 2, characterized in that the amount of gold deposited onto the tunnel barrier surface is equivalent to that of a continuous layer of gold of 20 to 40Å thickness.

4. Process as claimed in claim 1, characterized in that the gold layer (5) covers between 60 and 80% of the surface of the tunnel barrier (4).

5. Process as claimed in claim 1, characterized in that the oxide layer (8) formed in the regions (7) of the tunnel barrier (4) not covered by the gold layer (5) extends into the base electrode material (3).

6. Process as claimed in claim 5, characterized in that the thickness of the oxide layer (8) is between 40 and 60Å.

* * * * *